United States Patent [19]

Yamamoto et al.

[11] Patent Number: 4,959,018
[45] Date of Patent: Sep. 25, 1990

[54] ELECTRIC CONNECTION BOX

[75] Inventors: Masaki Yamamoto; Hisashi Sato; Keiichi Ozaki, all of Kosai, Japan

[73] Assignee: Yazaki Corporation, Tokyo, Japan

[21] Appl. No.: 372,595

[22] Filed: Jun. 28, 1989

[30] Foreign Application Priority Data

Jul. 15, 1988 [JP] Japan .............................. 63-93070[U]

[51] Int. Cl.⁵ ............................................. H01R 13/52
[52] U.S. Cl. ...................................... 439/76; 439/205; 174/52.1
[58] Field of Search .................. 439/76, 278, 281, 282, 439/283, 34, 901, 904, 205, 206, 519, 521, 548, 556, 559, 587, 589, 271; 174/52.1, 52.3, 251, 255, 259

[56] References Cited

U.S. PATENT DOCUMENTS

| 3,230,163 | 1/1966 | Dreyfus | 174/259 |
| 4,388,132 | 6/1983 | Hoge et al. | 174/259 |
| 4,781,600 | 11/1988 | Sugiyama et al. | |
| 4,781,621 | 11/1988 | Sugiyama et al. | |
| 4,871,884 | 10/1989 | Hayashi | 174/52.1 |

Primary Examiner—Eugene F. Desmond
Assistant Examiner—Walter G. Hanchuk
Attorney, Agent, or Firm—Sughrue, Mion, Zinn, Macpeak & Seas

[57] ABSTRACT

An electrical connection box for use with automobile wires. Improved waterproofing is provided by arranging bus bars in grooves defined by walls as a base plate, and overlying said bars with waterproof elements.

4 Claims, 2 Drawing Sheets

ELECTRIC CONNECTION BOX

BACKGROUND OF THE INVENTION

The invention relates to an electric connection box for automotive wiring or the like, and more particularly to such an electric connection box which prevents leakage current from developing in a bus bar circuit when water intrudes into the electric connection box or when water droplets, due to condensation, deposit on the electric connection box.

An electric connection box of this general type shown in FIG. 4 comprises a circuit board 1 composed of an electrically insulative base plate 3 and a plurality of bus bars (circuit 2 mounted on the base plate 3 to form a laminated construction, a box body 4 accommodating the circuit board 1, and a lid 5 covering the base plate 3. Tabs 6 extending upwardly and downwardly from the bus bars 2 are inserted into a fuse case 7 and a relay cavity 8, mounted on the lid 5, and a connector mounting portion 9 mounted on the bottom wall of the box body 4, and are connected to their mating terminals of fuses, relays, wire harness terminal connectors, etc., if necessary, through female-to-female lugterminal strips (not shown).

When such an electric connection box is to be used, for example, in an engine room, a waterproof cover 10 is fitted on the electric connection box. However, there is a risk that at the time of washing, water under high pressure intrudes into the electrical connection box through locks 11a and 11b and other parts. Further, since the temperature at the time of the running of the engine greatly differs from the temperature at the time when the engine is stopped, condensation deposits on the inner surface of the cover. As a result, water droplets reach the bus bars 2 through terminal insertion holes 12 in the fuse case 7, etc., and the tabs 6 to wet the bus bars 2, thereby developing a leakage current between the bus bars 2. This causes a malfunction in the control system and corrosion of the bus bars.

To deal with the above problem, as shown in FIGS. 4 and 5, it has been proposed to cover the uppermost layer of the circuit board 1 with a waterproof plate 13 to entirely cover the bus bars 2 and the insulative base plate 3 (Japanese Utility Model Unexamined Publication No. 172216/88 published on Nov. 9, 1988 and owned by the same assignee). Seats 14 are formed on the upper surface of the waterproof plate 13, and each seat 14 has an insertion hole 15 for passing the tab 6 therethrough. The height h1 of the seat 14 is sufficiently greater than the diameter h2 of the water droplet G in an attempt to prevent the intrusion of the water droplet g into the insertion hole 15.

Although the waterproof plate 13 shown in FIGS. 4 and 5 effectively prevents the water droplets from reaching the uppermost layer of the bus bars 2, the plate cannot prevent fine water droplets, produced by condensation, from intruding into the interior through a gap between the tab 6 and the inner surface of the insertion hole 15. Once the water thus intrudes, the waterproof plate 13, which forms a kind of a sealed construction, prevents evaporation of the water. As a result, there is a risk that a leakage current will flow through the lower layer of bus bars 2A and 2B for a long period of time.

SUMMARY OF THE INVENTION

The present invention seeks to overcome the above problems, and an object of this invention is to provide an electric connection box in which the development of leakage current is restrained with a simple construction, and even if water intrudes into the electric connection box or if condensation is formed thereon, such water is caused to evaporate quickly.

The above object has been achieved by an electric connection box wherein a plurality of bus bars and an electrically insulative base plate are stacked together to form a circuit board which is accommodated within a box body;

Characterized in that the uppermost layer of the bus bars within the box body are received respectively in grooves which are provided in a divided manner by ribs formed on the insulative base plate in a pattern corresponding to the arrangement of the bus bars; and the uppermost layer of the bus bars are covered with waterproof elements fitted respectively in the grooves.

DETAILED DESCRIPTION OF PREFERRED EMBODIMENTS

Figure 1:
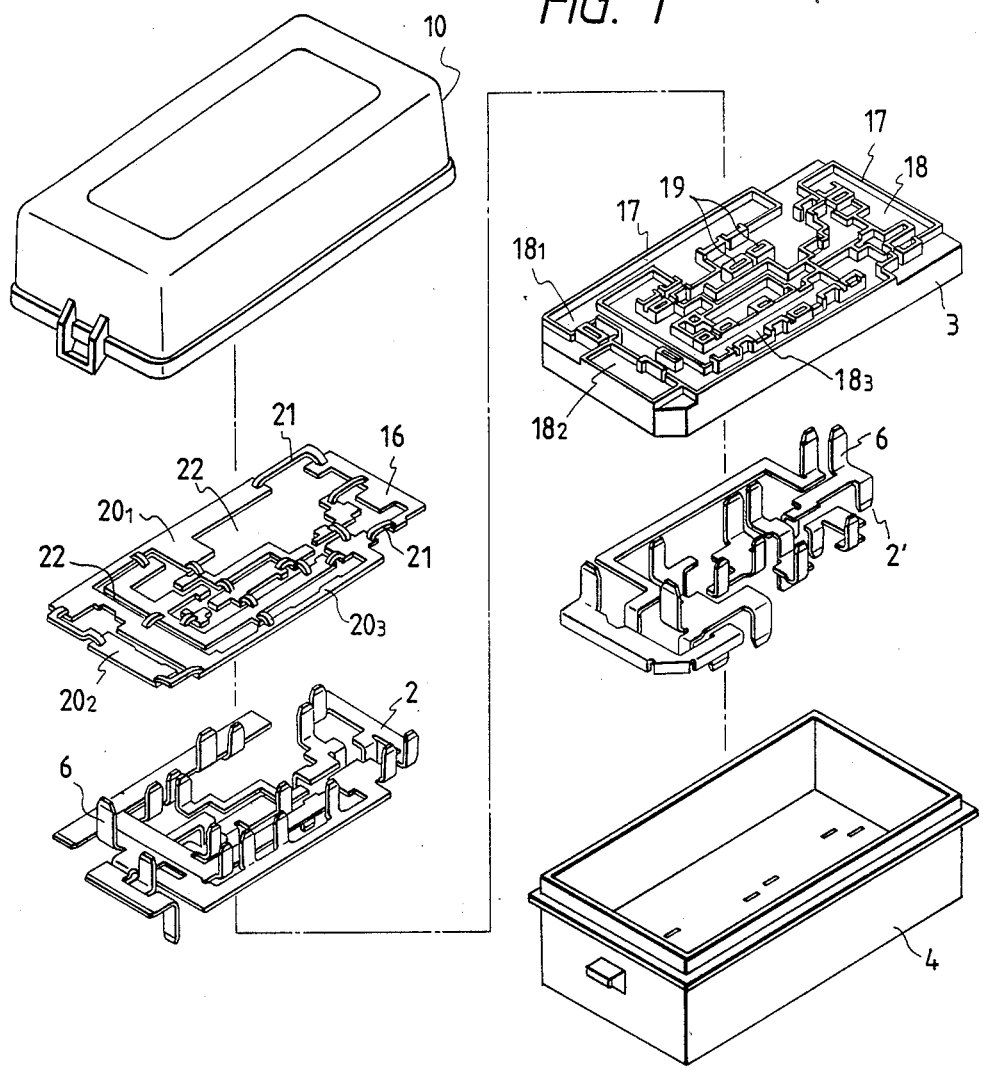
FIG. 1 is an exploded perspective view of an electric connection box provided in accordance with the present invention.

A preferred embodiment of the present invention will now be specifically described with reference to the drawings. Corresponding parts in this embodiment and the illustrated prior art are denoted by the same reference numerals, respectively.

Figure 4:
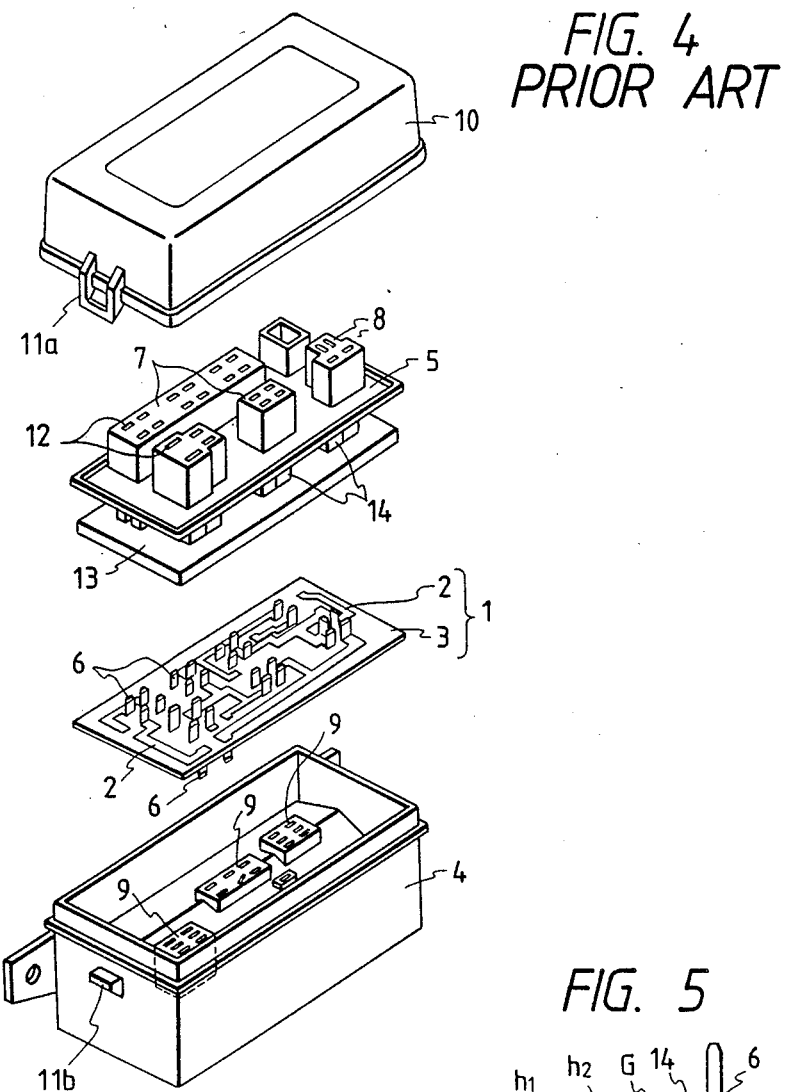
FIG. 4 is an exploded perspective view of a conventional electric connection box.
Figure 5:
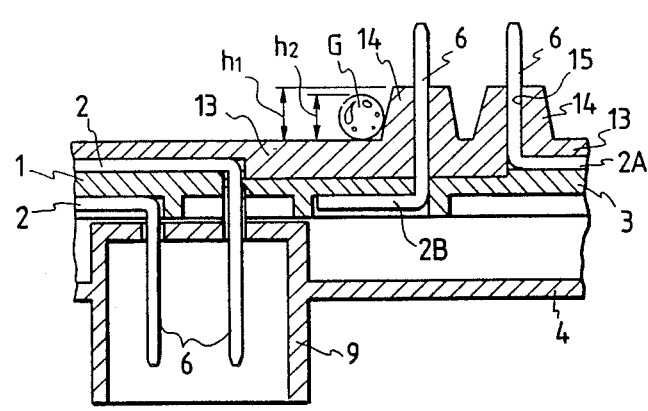
FIG. 5 is a fragmentary cross-sectional view of the electric connection box of FIG. 4.

In FIG. 1, reference numerals 2 and 2' denote bus bars having tabs 6, numeral 3 an electrically insulative base plate, numeral 4 a box body, numeral 10 a waterproof cover, and numeral 16 a water resistant lid. For illustration purposes only, the lid 5 shown in FIG. 4 is omitted in FIG. 1.

Figure 2:
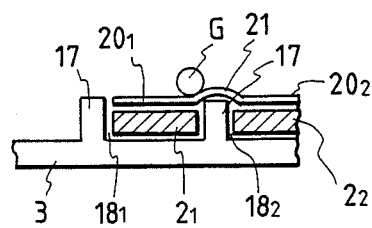
FIGS. 2 and 3 are fragmentary cross-sectional views, showing bus bars.
Figure 3:
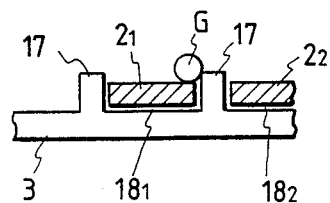

Ribs 17 are formed on the upper surface of the insulative base plate 3 on which the uppermost layer of bus bars 2 are mounted, the ribs 17 being arranged in a pattern corresponding to the arrangement of the bus bars 2 to form a plurality of grooves 18 ($18_1$, $18_2$, ... ) in a divided manner. Tab insertion seats 19, through which the tabs 6 extending upwardly from the lower layer of bus bars 2' pass, are formed on the upper surface of the insulative base plate 3. The tab insertion seats 19 are slightly higher than the ribs 17. As shown in FIGS. 2 and 3, each rib 17 has a height sufficiently greater than the thickness of the bus bar 2, such that the bus bar 2 is completely received in the groove 18.

The water resistant lid 16 comprises waterproof elements or pieces $20_1$, $20_2$, ... so shaped as to be fitted respectively in the plurality of grooves $18_1$, $18_2$, ..., and bridges 21 connecting the adjacent waterproof elements together so that the water resistant lid 16 is like a unitary plate. A plurality of apertures 22 in the shape of a slit, a polygon, etc., are formed between the adjacent waterproof elements.

A circuit board 1 is covered with the water resistant lid 16 after the bus bars 2 are received in the grooves 18 of the insulative base plate 3 to form the circuit board 1. In this condition, the waterproof elements $20_1, 20_2, \ldots$ fitted in their mating grooves $18_1, 18_2, \ldots$ cover the bus bars 2, as shown in FIGS. 2 and 3.

The grooves 18 for receiving the bus bars 2 may be formed by recesses formed in the insulative base plate of a greater thickness, instead of the ribs 17. Also, the waterproof elements $20_1, 20_2, \ldots$ may be separated from one another and be independentlly fitted in the respective grooves $18_1, 18_2, \ldots$ As shown in FIG. 2, the groove $18_1$ formed in the insulative base plate 3 so as to receive the bus bar $2_1$ is sufficiently deep that even when a water droplet G is deposited thereon, the development of a leakage current can be restrained to a certain degree since the creeping distance is long due to the provision of the rib 17 disposed between the bus bar $2_1$ and the bus bar $2_2$ disosed adjacent thereto.

However, the water droplet G directly deposits on the bus bar $2_1$ and collects in the groove (recess) $18_1$, and therefore by covering the bus bars with the waterproof elements $2_0$ and $20_2$ (FIG. 2), the direct deposition and collection of the water droplet G are prevented to thereby further restrain the development of the leakage current.

Further, even when the water droplet intrudes into a gap between the bus bar $2_1$ and the wall of the groove $18_1$ due to a capillary action, the gap is open due to the aperture 22, so that the water droplet is easily evaporated, and such an open construction makes it difficult for the condensation to develop in the interior of the circuit board.

As described above, in the present invention, the bus bars received in the grooves in the insulative base plate are covered with the waterproof elements to prevent the deposition and collection of water droplets. Therefore, development of leakage current, malfunction of the control system resulting therefrom, corrosion of the bus bars, etc., are prevented, thereby providing an electric connection box of high quality.

What is claimed is:

1. In an electric connection box of the type having at least one layer of bus bars disposed on an insulating base plate to form a circuit board, said circuit board being within said connection box; the improvement comprising:

means on said base plate defining grooves within which lie the bus bars of said at least one layer of bus bars;
    said grooves having a pattern corresponding to the pattern of said bus bars of said at least one layer;
    said means comprising walls surrounding said bus bars; and
    waterproof elements individually covering said bus bars within said grooves.

2. An electric connection box as claimed in claim 1, wherein said walls are comprised by raised ribs on said base plate.

3. An electric connection box as claimed in claim 1 or 2, wherein said walls surrounding said bus bars extend upward past an upper surface of said bus bars.

4. An electric connection box as claimed in claim 3, wherein said waterproof elements individually cover said bus bars and are connected together by bridge elements which overlay parts of said walls to thereby form a water resistant assembly.

* * * * *